United States Patent [19]

Taniguti

[11] Patent Number: 4,551,811
[45] Date of Patent: Nov. 5, 1985

[54] GROUND DETECTION ARRANGEMENT FOR AN A.C. GENERATOR

[75] Inventor: Ryosuke Taniguti, Nagasaki, Japan

[73] Assignee: Mitsubishi Denki Kabushiki Kaisha, Japan

[21] Appl. No.: 405,281

[22] Filed: Aug. 4, 1982

[30] Foreign Application Priority Data

Aug. 7, 1981 [JP] Japan ................................ 56-124882

[51] Int. Cl.$^4$ ...................... G06G 7/62; G08B 21/00
[52] U.S. Cl. ..................................... 364/481; 324/51;
340/648; 340/650; 361/50; 364/550
[58] Field of Search ............... 364/481, 483, 492, 550,
364/551, 734; 324/51, 52, 158 MG; 340/292,
648, 650, 660, 664, 659; 318/142, 144; 322/99;
361/42, 50

[56] References Cited

U.S. PATENT DOCUMENTS

| | | | |
|---|---|---|---|
| 3,303,410 | 2/1967 | Hoover et al. | 322/99 |
| 3,746,979 | 7/1973 | Kildishev et al. | 322/99 |
| 4,000,464 | 12/1976 | Nüssel | 361/42 |
| 4,138,706 | 2/1979 | Johnson et al. | 361/42 |
| 4,187,525 | 2/1980 | Nagura et al. | 364/482 X |
| 4,214,311 | 7/1980 | Nakashima et al. | 364/482 |

Primary Examiner—Errol A. Krass
Assistant Examiner—Kevin J. Teska
Attorney, Agent, or Firm—Leydig, Voit & Mayer

[57] ABSTRACT

The present invention relates to a ground detection arrangement for an A.C. generator in which positive and negative D.C. voltages are alternately applied to the neutral point of an armature winding so as to detect voltages proportional to ground currents corresponding to the respective D.C. voltages, a ground resistance is calculated using the sum of the absolute values of both the detected voltages, while a grounding position of a field winding is calculated using the relative sum, the calculated results being displayed, whereby the existence of grounding can be correctly detected regardless of the grounding position, and the grounding position of the field winding can be correctly known.

7 Claims, 3 Drawing Figures

GROUND DETECTION ARRANGEMENT FOR AN A.C. GENERATOR

BACKGROUND OF THE INVENTION

This invention relates to a ground detection arrangement for an A.C. generator. FIG. 1 illustrates an example of a conventional arrangement of the type of the present invention. In the FIG. 1, numeral 1 denotes a brushless A.C. generator, numeral 2 an armature winding, numeral 3 a three-phase full-wave rectifier, numeral 4 a field winding and numeral 5 an insulation resistance detector. The insulation resistance detector 5 includes both a D.C. voltage source (E) 8 and current relay 9 for the direct current introduced across a brush 6 and a slip ring 7 in between the neutral point C of armature winding 2 and the ground A. If the ground resistance (insulation resistance) $R_s$ is reduced to cause a current exceeding the critical reference value, the relay 9 is actuated. Numeral 10 denotes a protection resistor.

In such a conventional device, however, the current value $I_{sp}$ in the case of the grounding occurring on the side of the positive pole of field winding 4 and the current value $I_{sn}$ in the case of the grounding occurring on the side of the negative pole N are different from each other as follow:

$$I_{sp} = \frac{E - \frac{1}{2}E_f}{R_i + R_s} \quad (1)$$

$$I_{sn} = \frac{E + \frac{1}{2}E_f}{R_i + R_s} \quad (2)$$

where:
$E_f$ = Voltage of field winding
$R_i$ = Resistance value of protection resistor Therefore, conventional devices do not allow for correct detection of the existence of grounding in the field winding 4.

SUMMARY OF THE INVENTION

This invention has been introduced in order to eliminate the disadvantage described above, and has for its object to provide a ground detection arrangement for an A.C. generator in which positive and negative D.C. voltages are alternately applied to the neutral point of an armature winding so as to detect voltages proportional to ground currents corresponding to the respective D.C. voltages, a ground resistance is calculated using the sum of the absolute values of both the detected voltages, a grounding position of a field winding is calculated using the relative sum, the calculated results are displayed, whereby the existence of grounding can be correctly detected regardless of the grounding position, and, the grounding position of the field winding can be correctly known.

BRIEF DESCRIPTION OF THE DRAWINGS

In the drawings, the same symbols indicate the same or corresponding parts.

DESCRIPTION OF THE PREFERRED EMBODIMENT

Figure 1:
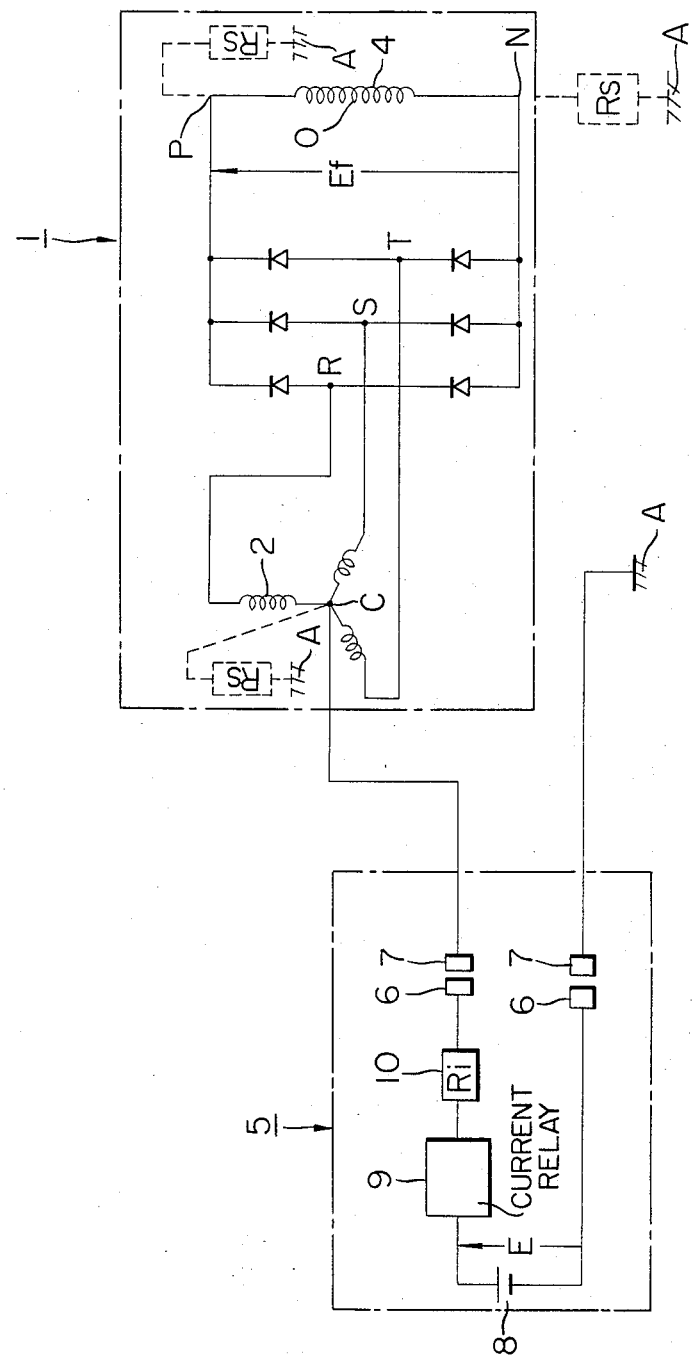
FIG. 1 is a circuit diagram of a ground detection arrangement for an A.C. generator in a prior art.
Figure 2:
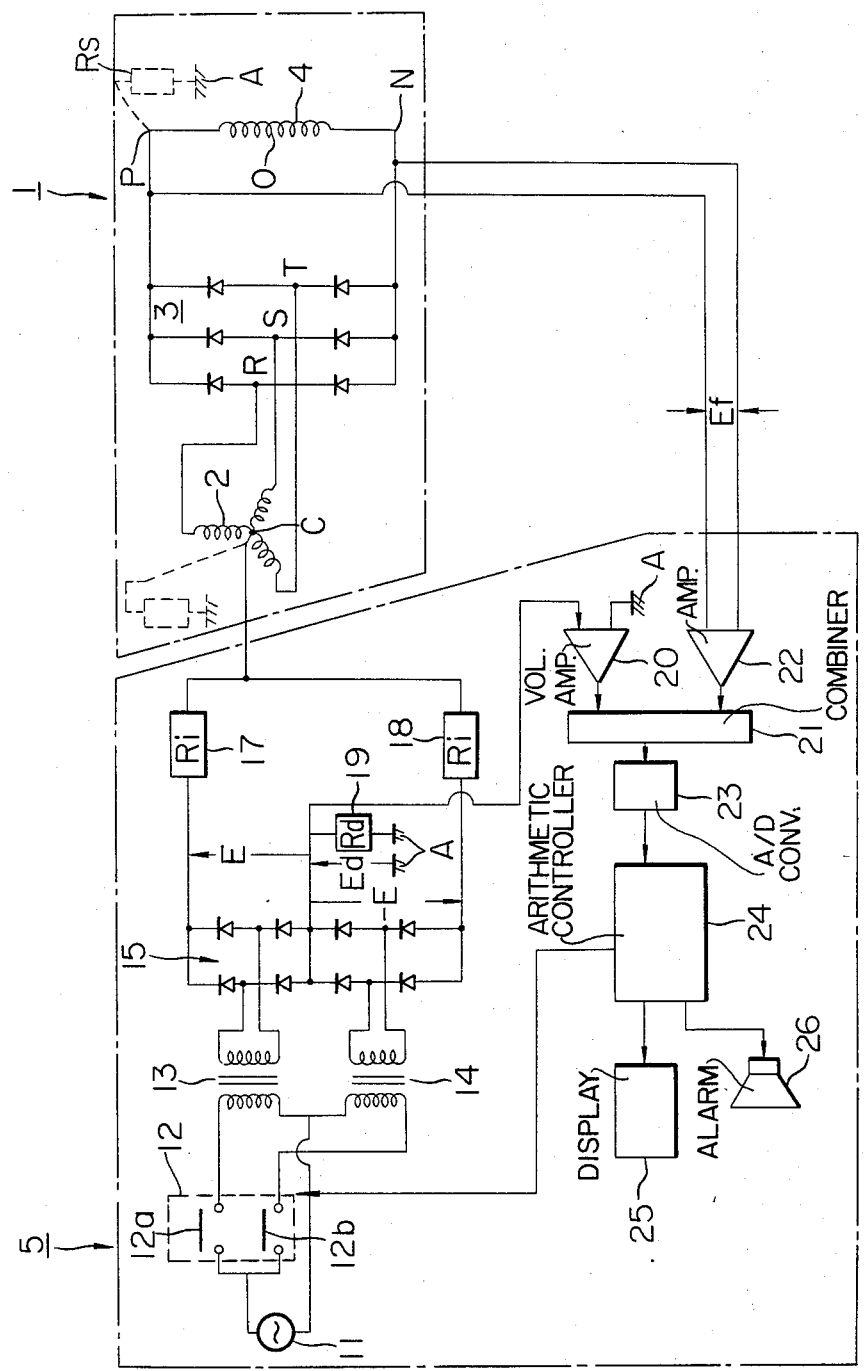
FIG. 2 is a circuit diagram of a ground detection arrangement for an A.C. generator according to the present invention.

In FIG. 2 showing an embodiment of the present invention, an A.C. source 11 is switchably connected to transformers 13 and 14 through the contacts 12a and 12b of a change-over switch 12. The output of the secondary winding of the transformer 13 is applied to a rectifier 15, while the output of the secondary winding of the transformer 14 is applied to a rectifier 16. The above change-over switch 12 comprises a suitable relay which has mechanical switching contcts or may comprise a semiconductor switch such as a thyristor or transistor apparatus. The D.C. output of the rectifier 15 (voltage E) is applied to the neutral point C of an armature winding 2 through a protection resistor 17, while the D.C. output of the rectifier 16 (voltage E) is applied to the neutral point C of the armature winding 2 through a protection resistor 18. The rectifiers 15 and 16 are connected in parallel. A detection resistor 19 (of lower resistance value $R_d$) is inserted between the connection point of the rectifiers 15, 16 and the ground A, and the potential of the connection point is supplied to an A/D converter 23 through a voltage amplifier 20 and is digitized after supplied to a combiner 21. Furthermore the combiner 21 receives the field voltage $E_f$ across a field winding 4 through an amplifier 22. The output of the combiner 21 is digitized with an A/D converter 23 to be supplied to an arithmetic controller 24. The arithmetic controller 24 executes the below-described calculation to supply a display device 25 with the calculated results and transmit an alarm signal to an alarm device 26 and moreover generate a switching signal for switching the contacts 12a, 12b of the change-over switch 12 at regular time intervals.

According to the above arrangement, D.C. voltages $+E$ and $-E$ are applied alternately to the neutral point C of the armature winding 2 for constant period respectively through protection resistor 17 and 18 having high resistance value $R_i$. In the case where the magnetizing circuit is functioning properly, the current does not flow through the detection resistance 19 because of very high resistance $R_s$ to the ground. For example, however, if the neutral point C is grounded, current of a level similar to that of the current at the ground point also flows across the detection resistor 19. The detected voltages $E_d$ at this time are respectively as indicated by the following equations 3 and 4 at the application of the D.C. voltage $+E$ and at the application of the D.C. voltage $-E$, and they are equal in forms of their absolute values. The same applies to points R, S, T and the middle point O of the field winding 4 in the figure.

When $E_{d+}$ and $E_{d-}$ denote developing across the detection resistance 19 at the times of applying the D.C. voltages $+E$ and $-E$, then $$E_{d+} = \frac{-E}{R_o} R_d \quad (3)$$

$$E_{d-} = \frac{E}{R_i} R_d \quad (4)$$

where $R_o = R_i + 2(R_d + R_s)$

However, in case of the field winding 4 being grounded and the ground point being the middle point O, the situation is the same as in the case of the neutral point being grounded. In case of any point other than the neutral point, e.g., the positive pole P, being grounded and if $E > E_f$, then $$E_{d+} = -\frac{E + E_f}{R_o} \quad (5)$$

$$E_{d-} = -\frac{E - E_f}{R_o} \quad (6)$$

On the other hand, in case of the negative pole N being grounded, $E_{d+}$ and $E_{d-}$ have different values as follows:

$$E_{d+} = -\frac{E - E_f}{R_o} \quad (7)$$

$$E_{d-} = \frac{E + E_f}{R_o} \quad (8)$$

Therefore, if the ground points are C, R, S, T and O, the sum of $E_{d+}$ and $E_{d-}$ is zero, whereas when the ground point lies from the middle point O of the field winding 4 toward positive pole P or toward negative pole N, the sum of $E_{d+}$ and $E_{d-}$ is negative or positive respectively. Accordingly, if the value of the ground resistance $R_s$ is known, the ground position L can be calculated from the sum of $E_{d+}$ and $E_{d-}$ and the field voltage $E_f$, while the value of the ground resistance $R_s$ can be calculated from the following equation (9):

$$R_s = \left( \frac{E}{|E_{d+}| + |E_{d-}|} - 1 \right) \cdot R_d - \frac{R_i}{2} \quad (9)$$

The ground position L, can be calculated by the following equation:

$$L = \frac{E_{d+} + E_{d-}}{2E_f \cdot R_d} \{R_i + 2(R_s + R_d)\} \quad (10)$$

That is, the exact position can be determined based on the following calculation:

(1) $E_{d+} + E_{d-} = 0. \ldots$ the grounding is either C or R or S or T, or at the middle point O of the field winding 4.

(2) $E_{d+} + E_{d-} > 0. \ldots$ If L=1, then the grounding is at the N of the point negative pole. If L=0.8, then a distance grounding is at the 8/10 parts of the total distance from 0 to N from the middle point O between above middle point O and point N of the negative pole.

(3) $E_{d+} + E_{d-} < 0. \ldots$ If L=1, then the grounding is at the point P of the positive pole. If L=0.4, then the grounding is at a distance 4/10 parts of the total distance from 0 to P from the middle point O between above middle point O and point P of the positive pole.

Through the detected voltages $E_{d+}$ and $E_{d-}$ are influenced by the field voltage $E_f$ as indicated by Equations (5)-(8), the sum of their absolute values $|E_{d+}|$, $|E_{d-}|$ is free from the influence of the field voltage $E_f$. Therefore the correct value of the ground resistance $R_s$ can be determined independently of the ground position of the field winding.

The arithmetic controller 24 receives alternatively the detection voltages $E_{d+}$ and $E_{d-}$ and the field voltage $E_f$ at the time of detection of these voltages through the combiner 21. The arithmetic controller 24 calculates the ground resistance $R_s$ and the ground position L using equations 9 and 10. When the value of the ground resistance $R_s$ becomes less than the predetermined reference value, the alarm signal is transmitted to the alarm device 24 so as to drive this device. In the case where the values of $E_{d+}$ and $E_{d-}$ are zero or approximately zero, such a calculation should not be executed.

As set forth above, according to this invention, positive and negative D.C. voltages are alternately applied across the neutral point of an armature winding and ground after which ground currents are converted into and detected as voltages by a detection resistance, the ground resistance is calculated by the use of the detected voltages, and this ground resistance is compared with a reference value so as to detect the existence of grounding. Herein, in calculating the ground resistance, the sum of the absolute values of the detected voltages at the application of the positive D.C. voltage and at the application of the negative D.C. voltage is employed, and hence, influences due to different ground positions of the field winding can be eliminated to enhance the precision of calculation, so that the existence of the substantial grounding can be detected more accurately than in the prior art.

Furthermore, because the sum of relative values of the detection voltages changing in correspondence with the ground position of the field winding the values of field winding voltage and the ground resistance are employed to calculate the ground position of the field winding, the ground position can be determined accurately.

Figure 3:
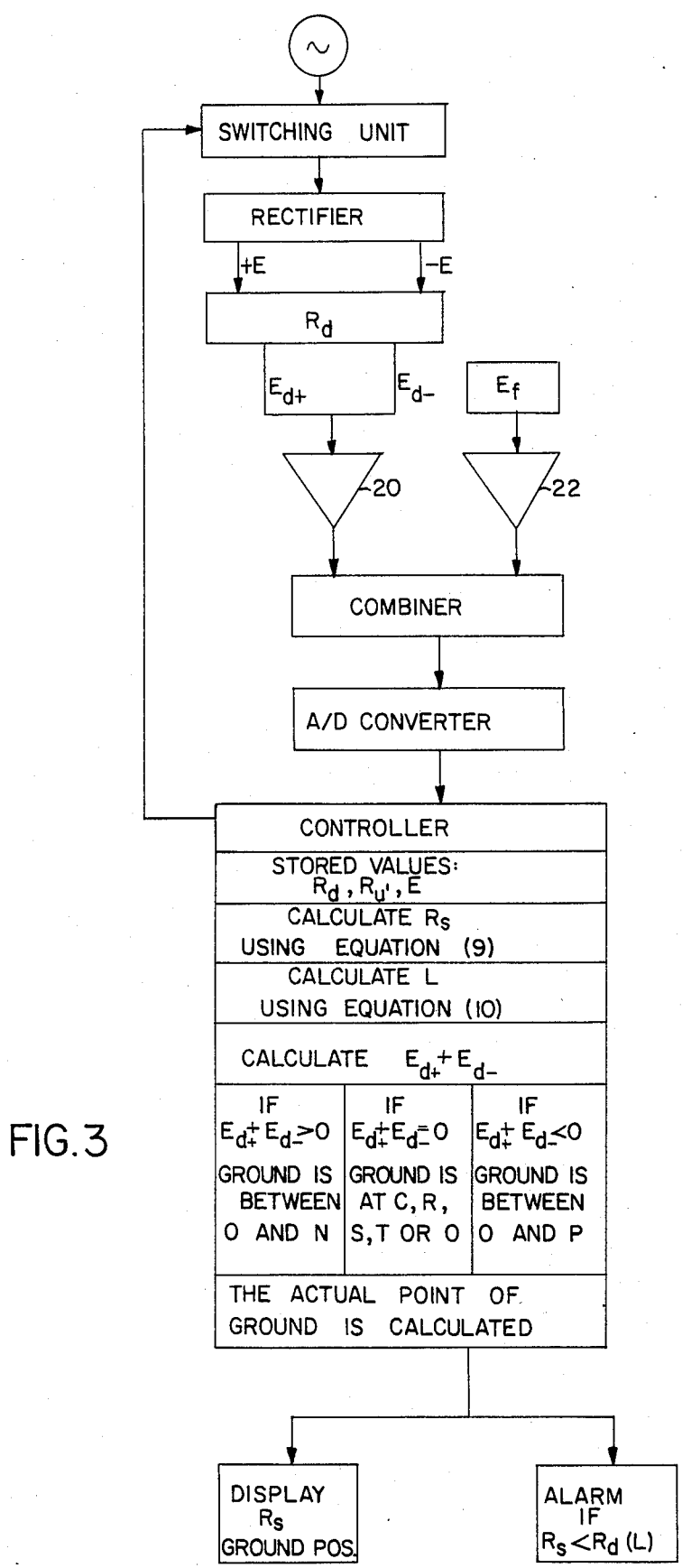
FIG. 3 is a flow diagram to explain the steps followed in determining the values of insulation resistance and location of grounds detected by the arrangement of the invention.

In summary, referring to the flow diagram of FIG. 3, $E_{d+}$ and $E_{d-}$ are detected as the voltages across the resistor $R_d$ and are alternatively fed into the combiner 21 at a frequency which is controlled by the controller 24. The field voltage $E_f$ is also fed into the combiner 21. The combiner 21 feeds the combined (mixed) voltages through an A/D converter 23 to the controller 24. Values of $R_d$, $R_i$ and E are stored in the controller 24. The controller 24 calculates the sum $E_{d+} + E_{d-}$ and $R_s$ using equation 9, and using $R_s$, L is then calculated using equation 10. If the sum $E_{d+} + E_{d-} = 0$, the controller determines that the ground is at either C or R or S or T or O. If the sum $E_{d+} + E_{d-}$ is greater than 0, the controller determines that the ground is between O and N and the actual point of ground is calculated using the value of L. If $E_{d+} + E_{d-}$ is less than 0, the controller determines that the ground is between O and P. The actual point of ground is calculated using the value of L. The value of insulation resistance $R_s$ and the actual point of ground are then displayed and an alarm is actuated if $R_s$ is less than a predetermined reference value for that ground point.

What is claimed is:

1. A ground detection arrangement for an A.C. generator comprising:

resistors ($R_i$) of high resistance connected to a neutral point of an armature winding of the A.C. generator;

a voltage source of positive and negative D.C. voltages (+E) and (−E) alternately applied to the neutral point of said armature winding through said resistors ($R_i$);

a detecting resistor ($R_d$) connected between the D.C. voltage source and the ground of the circuit arrangement;

an arithmetic controller connected to receive detected voltages developed across said detecting resistor ($R_d$) when the respective positive and negative D.C. voltages ($+E$) and ($-E$) are applied, and including means for calculating a ground resistance ($R_s$) on the basis of a sum of absolute values of both the detected voltages ($E_{d+}$) and ($E_{d-}$) and said D.C. voltages ($+E$) and ($-E$) and said resistors ($R_i$) and ($R_d$) and for comparing the calculated result for ground resistance ($R_s$) with a reference resistance value;

means for deriving the voltage ($E_f$) of a field winding and applying it to said airthmetic controller, said arithmetic controller including means for calculating a ground position (L) on the basis of a relative sum of both said detected voltages ($E_{d+}$) and ($E_{d-}$), the calculated ground resistance ($R_s$), and the field winding voltage ($E_f$); and a display device to display the calculated ground resistance ($R_s$) and the actual ground position based on the calculated ground position (L).

2. A ground detection arrangement for an A.C. generator as defined in claim 1 wherein:

said arithmetic controller transmits an alarm signal when the ground resistance has become smaller than a predetermined reference value.

3. A ground detection arrangement for an A.C. generator as defined in claim 1 wherein:

said D.C. voltage source is obtained alternately from first and second rectifiers connected in parallel to each other and respectively connected to the secondary sides of first and second transformers connected in parallel to each other and to an A.C. voltage source through a change-over switch.

4. A ground detection arrangement for an A.C. generator as defined in claim 3 wherein:

said detecting resistor is connected between ground and the output junction point of said first and second parallel connected rectifiers.

5. A ground detection arrangement for an A.C. generator as defined in claim 3 wherein:

said arithmetic controller transmits a signal for operating said change-over switch at predetermined time intervals.

6. A ground detection arrangement for an A.C. generator as defined in claim 1, the detected voltages developed across said detecting resistor being applied alternately to said arithmetic controller through an amplifier and combiner, and an analog-digital convertor.

7. A ground detection arrangement for an A.C. generator as defined in claim 1, wherein:

the armature winding and the field winding of said generator are connected to each other through rectifiers.

* * * * *